United States Patent
Long

(10) Patent No.: US 12,020,617 B2
(45) Date of Patent: Jun. 25, 2024

(54) DISPLAY DEVICE WITH EACH ROW OF PIXELS DISPOSED BETWEEN TWO SCANNING LINES, AND ELECTRONIC EQUIPMENT

(71) Applicant: SUZHOU CHINA STAR OPTOELECTRONICS TECHNOLOGY CO., LTD., Suzhou (CN)

(72) Inventor: Zhijuan Long, Suzhou (CN)

(73) Assignee: SUZHOU CHINA STAR OPTOELECTRONICS TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/988,054

(22) Filed: Nov. 16, 2022

(65) Prior Publication Data
US 2024/0054930 A1    Feb. 15, 2024

(30) Foreign Application Priority Data
Aug. 15, 2022    (CN) .......................... 202210975431.4

(51) Int. Cl.
G09G 3/20    (2006.01)
G09G 3/36    (2006.01)
H01L 27/12    (2006.01)

(52) U.S. Cl.
CPC ............ *G09G 3/20* (2013.01); *G09G 3/3607* (2013.01); *H01L 27/124* (2013.01); *G09G 2300/0426* (2013.01); *G09G 2300/0809* (2013.01); *G09G 2310/0213* (2013.01); *G09G 2310/0267* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 2011/0128269 A1* | 6/2011 | Lee | .......................... | G02B 30/25 345/211 |
| 2012/0086687 A1* | 4/2012 | Tsubata | ................ | G09G 3/3659 345/55 |
| 2014/0111556 A1* | 4/2014 | Chen | ...................... | G09G 3/207 345/88 |
| 2016/0351151 A1* | 12/2016 | Cao | ........................ | H01L 27/124 |

* cited by examiner

*Primary Examiner* — Amr A Awad
*Assistant Examiner* — Donna V Bocar
(74) *Attorney, Agent, or Firm* — Nathan & Associates; Menachem Nathan

(57) ABSTRACT

A display device and an electronic equipment are provided, which are belonging to a field of display technology. The display device includes a plurality of scanning lines and a plurality of pixels. By constructing a first scanning line and a second scanning line on two sides of a pixel row in a first direction, an overlapping of the first scanning line and/or the second scanning line with the pixel row in a thickness direction of the display device can be avoided, thereby keeping the voltages of the sub pixel electrodes of two adjacent pixels in a same row are the same.

9 Claims, 3 Drawing Sheets

DISPLAY DEVICE WITH EACH ROW OF PIXELS DISPOSED BETWEEN TWO SCANNING LINES, AND ELECTRONIC EQUIPMENT

FIELD OF INVENTION

The present application relates to a field of display technology, and in particular, to a display device and an electronic equipment.

BACKGROUND OF INVENTION

As shown in FIG. 1, in a display product in the related art, a pixel row is driven by two scanning lines. That is, a scanning line GLN−1 is connected to a left side pixel in the pixel row, and a scanning line GLN is connected to a right side pixel in the pixel row.

The left side pixel includes a first main pixel electrode MP1, a first sub pixel electrode SP1, a first main thin film transistor T11, a first sub thin film transistor T12, and a first sharing thin film transistor T13. The right side pixel includes a second main pixel electrode MP2, a second sub pixel electrode SP2, a second main thin film transistor, a second sub thin film transistor, and a second sharing thin film transistor. A common electrode line COM is connected to the first sharing thin film transistor T13 and the second sharing thin film transistor. The data line DL is connected to the first main thin film transistor T11, the first sub thin film transistor T12, the second main thin film transistor, and the second sub thin film transistor.

The scanning line GLN extends across the first sub thin film transistor T12, and such a cross-line condition causes a parasitic capacitance Cgs2 to exist between the scanning line GLN and the first sub pixel electrode SP1.

As shown in FIG. 1 and FIG. 2, a scanning line GLN−1 is configured to transmit a scanning signal GN−1. A scanning line GLN is configured to transmit a scanning signal GN. VSP1 represents a voltage of the first sub pixel electrode SP1. Due to an existence of a parasitic capacitance Cgs2, a voltage of the first sub pixel electrode SP1 is pulled down twice when an electrical potential of the scanning signal GN is switched from a high electrical potential to a low electrical potential, resulting in a difference between the voltage of the first sub pixel electrode SP1 and a voltage of the second sub pixel electrode SP2. At this time, a brightness of an area where the first sub pixel electrode SP1 is positioned is less than a brightness of an area where the second sub pixel electrode SP2 is positioned, thereby causing uneven display.

SUMMARY OF INVENTION

The present application provides a display device and an electronic equipment to alleviate a technical problem of differences in the voltages of sub pixel electrodes of two adjacent pixels in a same row.

In a first aspect, the present application provides a display device. The display device includes a plurality of scanning lines and a plurality of pixels. The plurality of scanning lines include at least one group of scanning lines. Each group of scanning lines includes a first scanning line and a second scanning line sequentially arranged along a first direction. The plurality of pixels includes at least one pixel row. Each pixel row includes at least one pixel group. Each pixel group includes a first pixel and a second pixel arranged in sequence along a second direction, wherein a pixel row is positioned between the first scanning line and the second scanning line in the first direction, wherein the first scanning line is electrically connected to the first pixel of each pixel group in the pixel row, and wherein the second scanning line is electrically connected to the second pixel of each pixel group in the pixel row.

In some of the embodiments, the first pixel includes a first main thin film transistor, a first sub thin film transistor, a first sharing thin film transistor, a first main pixel electrode, a first sub pixel electrode, and a first connection line. One of a source electrode or a drain electrode of the first main thin film transistor is connected to the first main pixel electrode, wherein the first sub pixel electrode is connected to one of a source electrode or a drain electrode of the first sub thin film transistor and one of a source electrode or a drain electrode of the first sharing thin film transistor, wherein the first main pixel electrode and the first sub pixel electrode are arranged in sequence along the first direction, wherein the first main thin film transistor is positioned between the first scanning line and the first sub pixel electrode in the first direction, wherein the first sub thin film transistor and the first sharing thin film transistor are positioned between the first main pixel electrode and the second scanning line in the first direction, and wherein a gate electrode of the first main thin film transistor is directly connected to the first scanning line, wherein the first scanning line is connected to a gate electrode of the first sub thin film transistor and a gate electrode of the first sharing thin film transistor through the first connection line, and wherein the first connection line surrounds the first main pixel electrode.

In some embodiments, the display device further includes a data line and a first common electrode line. The data line is positioned between the first pixel and the second pixel in the second direction, wherein the data line is close to the first main thin film transistor and the first sub thin film transistor in the second direction, wherein the data line is connected to another one of the source electrode or the drain electrode of the first main thin film transistor and another one of the source electrode or the drain electrode of the first sub thin film transistor, wherein the first common electrode line and the data line are arranged in sequence along the second direction and are respectively positioned on two sides of the first pixel in the second direction, wherein the first common electrode line is close to the first sharing thin film transistor in the second direction, and wherein the first common electrode line is connected to another one of the source electrode or the drain electrode of the first sharing thin film transistor.

In some of the embodiments, the first connection line includes a first trace and a second trace. The first trace positioned between the first common electrode line and the first main pixel electrode in the second direction, wherein the first trace is connected to the first scanning line. The second trace connected to the first trace, the gate electrode of the first sub thin film transistor, and the gate electrode of the first sharing thin film transistor, and wherein the second trace is positioned between the first main pixel electrode and the first sub thin film transistor and/or the first sharing thin film transistor in the first direction.

In some of the embodiments, the second pixel includes a second main thin film transistor, a second sub thin film transistor, a second sharing thin film transistor, a second main pixel electrode, a second sub pixel electrode, and a second connection line, wherein one of a source electrode or a drain electrode of the second main thin film transistor is connected to the second main pixel electrode, wherein another one of the source electrode or the drain electrode of the second main thin film transistor is connected to the data line, wherein the second sub pixel electrode is connected to one of a source electrode or a drain electrode of the second sub thin film transistor, and one of a source electrode or a drain electrode of the second sharing thin film transistor, and wherein another one of the source electrode or the drain electrode of the second sub thin film transistor is connected to the data line; wherein the second sub pixel electrode and the second main pixel electrode are arranged in sequence along the second direction, wherein the second main thin film transistor is positioned between the second scanning line and the second sub pixel electrode in the second direction, and wherein the second sub thin film transistor and the second sharing thin film transistor are positioned between the second scanning line and the second main pixel electrode in the second direction; and wherein a gate electrode of the second main thin film transistor is directly connected to the second scanning line, wherein the second scanning line is connected to a gate electrode of the second sub thin film transistor and a gate electrode of the second sharing thin film transistor through the second connection line, and wherein the second connection line surrounds the second main pixel electrode.

In some of the embodiments, the display device further includes a second common electrode line, wherein the data line and the second common electrode line are arranged in sequence along the second direction and positioned on two sides of the second pixel along the second direction, wherein the second common electrode line is close to the second sharing thin film transistor in the second direction, and wherein the second common electrode line is connected to another one of the source electrode or the drain electrode of the second sharing thin film transistor; and wherein the data line is close to the second main thin film transistor and the second sub thin film transistor in the second direction In some of the embodiments, the second connection line includes a first wire and a second wire. The first wire is connected to the second scanning line, wherein the first wire is positioned between the second main pixel electrode and the second common electrode line in the second direction. The second wire is connected to the first wire, the gate electrode of the second sub thin film transistor, and the gate electrode of the second sharing thin film transistor, wherein the second wire is positioned between the second main pixel electrode and the second sub thin film transistor and/or the second sharing thin film transistor in the first direction.

In some embodiments, the display device further includes a gate driving circuit and at least one multiplexing circuit, wherein the gate driving circuit is configured to output at least one scanning signal, wherein an input terminal of the multiplexing circuit is connected to an output terminal of the gate driving circuit, wherein a first output terminal of the multiplexing circuit is connected to the first scanning line, wherein the second output terminal of the multiplexing circuit is connected to the second scanning line, wherein the multiplexing circuit is configured to output the first scanning signal and the second scanning signal according to one of the scanning signals, wherein the first scanning line is configured to transmit the first scanning signal, wherein the second scanning line is configured to transmit the second scanning signal, and wherein a pulse of the first scanning signal is earlier than a pulse of the second scanning signal in one frame.

In some embodiments, the multiplexing circuit includes: a first transistor and a second transistor, wherein one of a source electrode or a drain electrode of the first transistor is connected to the output terminal of the gate driving circuit, and another one of the source electrode or the drain electrode of the first transistor is connected to the first scanning line, wherein a gate electrode of the first transistor is connected to a first control terminal, wherein one of a source electrode or a drain electrode of the second transistor is connected to one of the source electrode or the drain electrode of the first transistor, wherein another one of the source electrode or the drain electrode of the second transistor is connected to the second scanning line, and wherein a gate electrode of the second transistor is connected to a second control terminal or a first control terminal.

In a second aspect, the present application provides an electronic equipment, which includes the display device in at least one of the above-mentioned embodiments, wherein a first scanning line in one scanning line group and a second scanning line in the other scanning line group are disposed between two adjacent pixel rows.

In the display device and electronic equipment provided by the present application, by constructing a first scanning line and a second scanning line on two sides of a pixel row in a first direction, it is possible to avoid overlapping of the first scanning line and/or the second scanning line with the pixel row in a thickness direction of the display device, which can prevent the sub pixel electrode of the first pixel from being affected by an electrical potential change of the scanning signal, that is, an influence of a secondary feeder voltage, thereby maintaining voltages of the sub pixel electrodes of two adjacent pixels in a same row are the same, and improving a luminance uniformity of the sub pixel opening areas of two adjacent pixels in a same row.

DETAILED DESCRIPTION OF EMBODIMENTS

In order to make the objectives, technical solutions, and effects of the present application clearer and more specific, the present application will be further described in detail below with reference to the accompanying figures and examples. It should be understood that the specific embodiments described herein are only used to explain the present application, but not to limit the present application.

Figure 1:
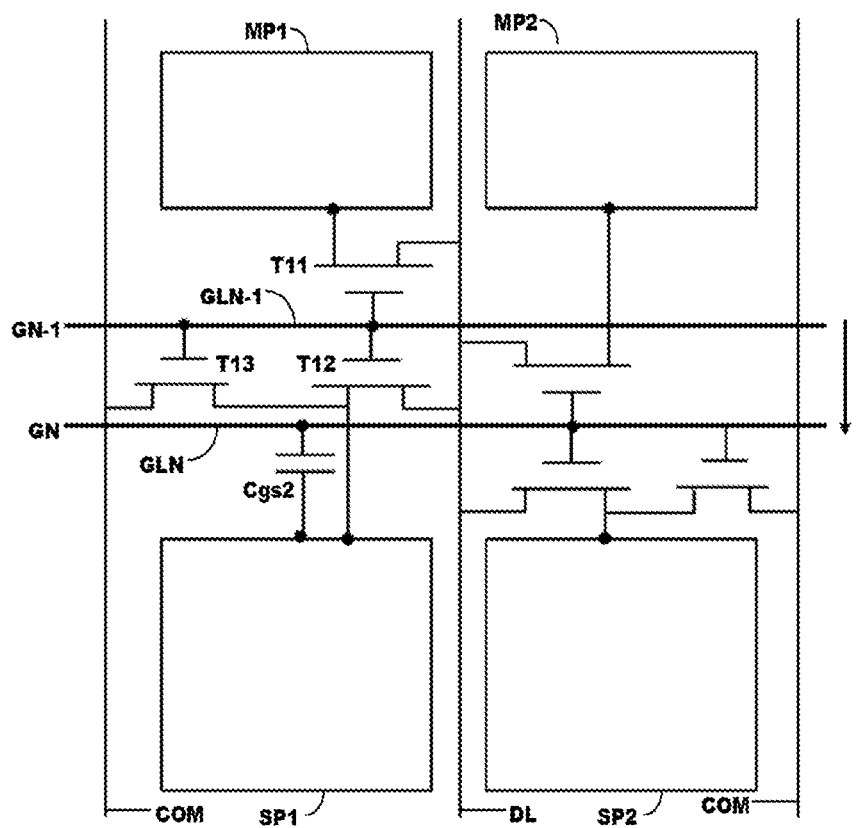
FIG. 1 is a schematic structural diagram of a display device in the related art.
Figure 2:
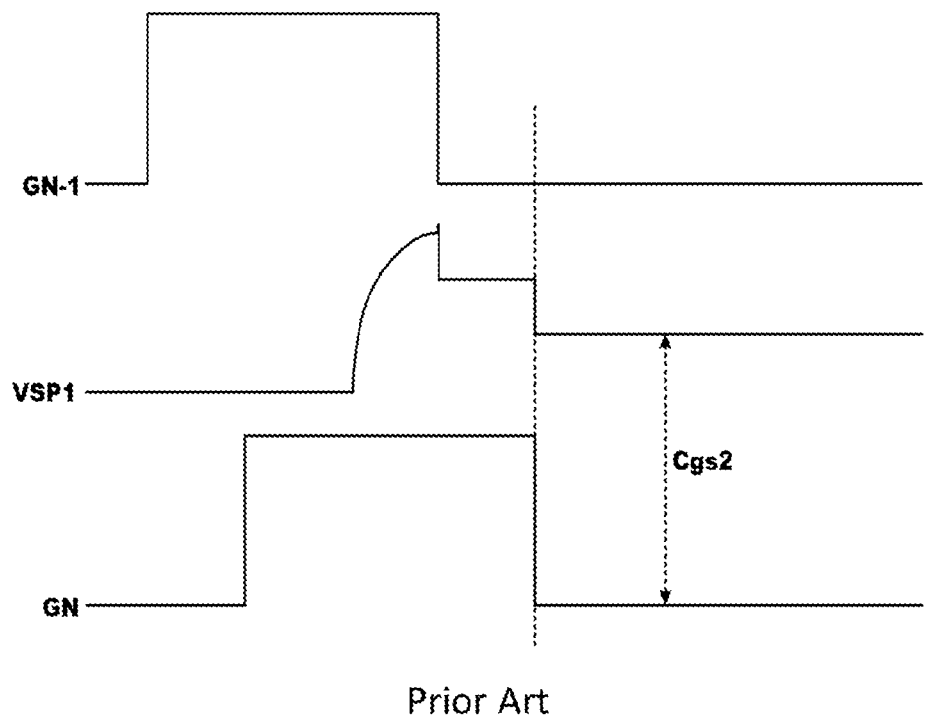
FIG. 2 is a schematic diagram of voltage changes of some signals in the display device shown in FIG. 1.
Figure 3:
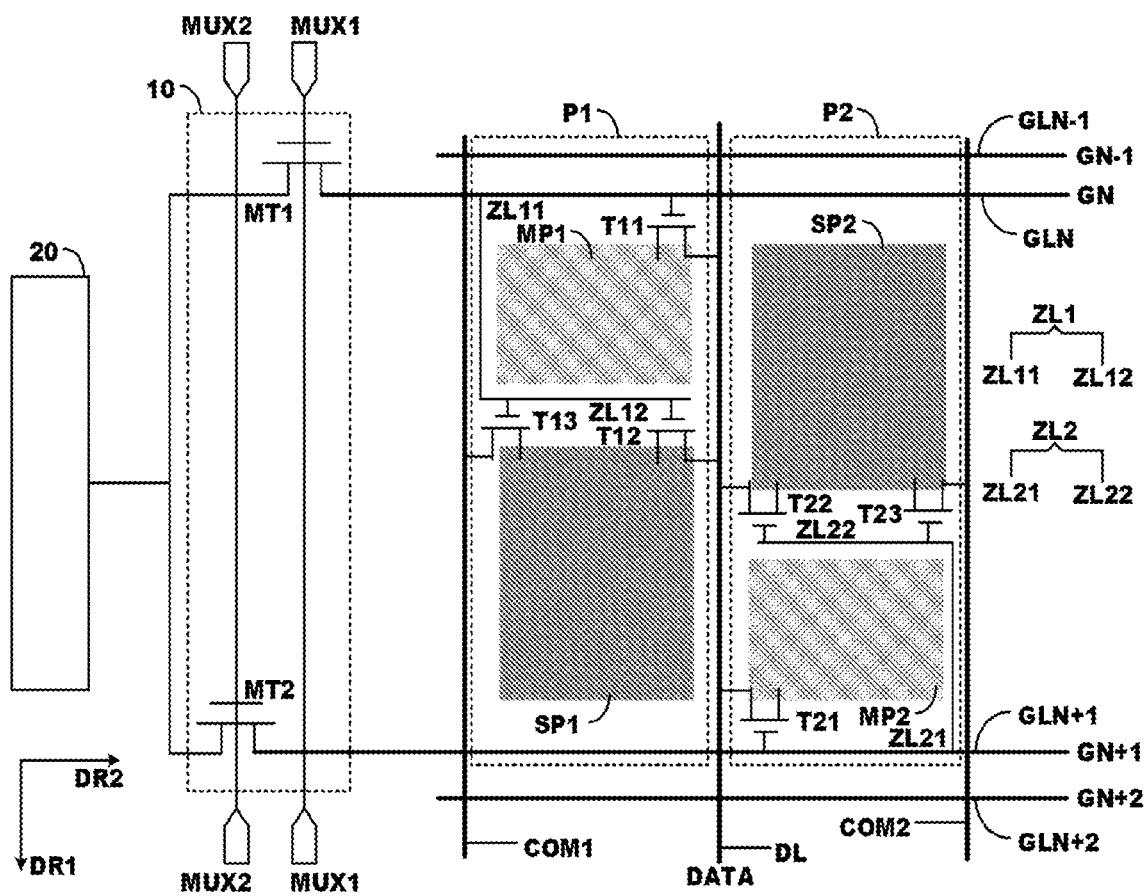
FIG. 3 is a schematic structural diagram of a display device provided by one embodiment of the present application.

In view of the aforementioned technical problem that the voltages of the sub pixel electrodes of two adjacent pixels in a same row are different, the present embodiment provides a display device, as shown in FIG. 3, the display device includes a plurality of scanning lines and a plurality of pixels. The plurality of scanning lines may be sequentially arranged along a first direction DR1, for example, a scanning line GLN−1, a scanning line GLN, a scanning line GLN+1, and a scanning line GLN+2, etc., which are arranged in sequence along the first direction DR1.

The scanning line GLN−1 is configured to transmit a scanning signal GN−1, the scanning line GLN is configured to transmit a scanning signal GN, the scanning line GLN+1 is configured to transmit a scanning signal GN+1, and the scanning line GLN+2 is configured to transmit a scanning signal GN+2.

In one frame, a pulse of the scanning signal GN−1, a pulse of the scanning signal GN, a pulse of the scanning signal GN+1, and the pulse of the scanning signal GN+2 etc. appear in sequence. That is, the display device may, but is not limited to, implement progressive scanning in a forward scanning manner, and simultaneously scan a pixel row in two batches successively.

In one embodiment of the present application, the plurality of scanning lines includes at least one group of scanning lines.

It should be noted that, in this embodiment, a plurality of scanning lines can be grouped, wherein each group of scanning lines is configured to drive one pixel row, compared with driving one pixel row by a single scanning line, a load of each scanning line can be reduced. Therefore, each scanning line in this embodiment may be smaller in width and/or thickness.

Each group of scanning lines includes a first scanning line and a second scanning line arranged in sequence along a first direction DR1. For example, a first scanning line may be a scanning line GLN, a second scanning line may be a scanning line GLN+1. That is to say, the scanning line GLN and the scanning line GLN+1 for driving a same pixel row can form a group of scanning lines, and other groups of scanning lines can be deduced by analogy.

The plurality of pixels may be distributed in an array in the display device.

The plurality of pixels include at least one pixel row, for example, a pixel row where a first pixel P1, a second pixel P2 . . . and so on are positioned.

Each pixel row includes at least one pixel group. Each pixel group includes a first pixel P1 and a second pixel P2 arranged in sequence along a second direction DR2. That is to say, a pixel group in this embodiment may include two pixels, and it can be understood that this is a minimum configuration of a pixel group. In other embodiments, one pixel group may also include three pixels, four pixels, and so on.

A pixel row is positioned between a first scanning line GLN and a second scanning line GLN+1 in the first direction DR1, wherein the first scanning line GLN is electrically connected to the first pixel P1 of each pixel group in the pixel row, and wherein the second scanning line GLN+1 is electrically connected to the second pixel P2 of each pixel group in the pixel row.

It can be understood that, in the display device provided in this embodiment, by constructing the first scanning line GLN and the second scanning line GLN+1 on two sides of a pixel row in the first direction DR1, it is possible to avoid overlapping of the first scanning line GLN and/or the second scanning line GLN+1 with the pixel row in a thickness direction of the display device, it can prevent the first sub pixel electrode SP1 of the first pixel P1 from being affected by an electrical potential change of the scanning signal, that is, the secondary feeder voltage. Further, the voltages of the sub pixel electrodes of two adjacent pixels in a same row can be kept the same, thereby improving a luminance uniformity in the sub pixel aperture areas of two adjacent pixels in a same row.

In one embodiment, the first pixel P1 includes a first main thin film transistor T11, a first sub thin film transistor T12, a first sharing thin film transistor T13, a first main pixel electrode MP1, a first sub pixel electrode SP1, and a first connection line ZL1. One of a source electrode or a drain electrode of the first main thin film transistor T11 is connected to the first main pixel electrode MP1. The first sub pixel electrode SP1 is connected to one of a source electrode or a drain electrode of the first sub thin film transistor T12 and one of the source electrode or the drain electrode of the first sharing thin film transistor T13.

The first main pixel electrode MP1 and the first sub pixel electrode SP1 are arranged in sequence along the first direction DR1. The first main thin film transistor T11 is positioned between a first scanning line GLN and a first sub pixel electrode SP1 in a first direction DR1. The first sub thin film transistor T12 and the first sharing thin film transistor T13 are positioned between the first main pixel electrode MP1 and the second scanning line in the first direction DR1.

It should be noted that in this embodiment, the positions of the first main thin film transistor T11, the first sub thin film transistor T12, and the first sharing thin film transistor T13 in the first pixel P1 can be reasonably arranged, which not only reduces the mutual connection paths, and minimizes coupling caused by crossovers between these connection paths.

A gate electrode of the first main thin film transistor T11 is directly connected to the first scanning line GLN. The first scanning line GLN is connected to a gate electrode of the first sub thin film transistor T12 and a gate electrode of the first sharing thin film transistor T13 through a first connection line ZL1, wherein the first connection line ZL1 surrounds the first main pixel electrode MP1.

It should be noted that the gate electrode of the first main thin film transistor T11 can be integrally formed with the first scanning line GLN to reduce the manufacturing process. Similarly, the first scanning line GLN, the first connection line ZL1, and gate electrode of the first sub thin film transistor T12 and the first sharing thin film transistor T13 can also be integrally formed or constructed in a same film layer to reduce the manufacturing process. The first connection line ZL1 surrounds the first main pixel electrode MP1 can prevent the first connection line ZL1 and the first main pixel electrode MP1 from overlapping in the thickness direction of the display device to generate corresponding parasitic capacitance. The thickness direction may be perpendicular to the first direction DR1 and/or the second direction DR2.

In one embodiment, the display device further includes a data line DL and a first common electrode line COM1. The data line DL is positioned between the first pixel P1 and the second pixel P2 in the second direction DR2. The data line DL is positioned close to the first main thin film transistor T11 and the first sub thin film transistor T12 in the second direction DR2. The data line DL is connected to another one of the source electrode or the drain electrode of the first main thin film transistor T11 and another one of the source electrode or the drain electrode of the first sub thin film transistor T12.

The data line DL is configured to transmit the data signal DATA.

It can be understood that, by reasonably setting the positional relationship among the data line DL, the first main thin film transistor T11, and the first sub thin film transistor T12, the connection paths between them can be minimized and a transmission loss can be reduced.

The first common electrode line COM1 and the data line DL are arranged in sequence along the second direction DR2 and are respectively positioned on two sides of the first pixel P1 in the second direction DR2. The first common electrode line COM1 is close to the first sharing thin film transistor T13 in the second direction DR2. The first common electrode line COM1 is connected to another one of the source electrode or the drain electrode of the first sharing thin film transistor T13.

It can be understood that setting the position of the first common electrode line COM1 reasonably can reduce a connection path from the first common electrode line COM1 to another one of the source electrode or the drain electrode of the first sharing thin film transistor T13, thereby reducing the transmission loss.

In one embodiment, the first connection line ZL1 includes a first trace ZL11 and a second trace ZL12. The first trace ZL11 is positioned between the first common electrode line COM1 and the first main pixel electrode MP1 in the second direction DR2. The first trace ZL11 is connected to the first scanning line. The second trace ZL12 is connected to the first trace ZL11. The gate electrode of the first sub thin film transistor T12 is connected to the gate electrode of the first sharing thin film transistor T13. The second trace ZL12 is positioned between the first main pixel electrode MP1 and the first sub thin film transistor T12 and/or the first sharing thin film transistor T13 in the first direction DR1.

It should be noted that setting a specific routing path of the first connection line ZL1 in this way can avoid overlapping or crossing with other metal routing lines or electrodes, thereby reducing mutual coupling or parasitic capacitance.

In one embodiment, the second pixel P2 includes a second main thin film transistor T21, a second sub thin film transistor T22, a second sharing thin film transistor T23, a second main pixel electrode MP2, a second sub pixel electrode SP2, and a second connection Line ZL2. One of a source electrode or a drain electrode of the second main thin film transistor T21 is connected to the second main pixel electrode MP2. Another one of the source electrode or the drain electrode of the second main thin film transistor T21 is connected to the data line DL. The second sub pixel electrode SP2 is connected to one of a source electrode or a drain electrode of the second sub thin film transistor T22, one of a source electrode or a drain electrode of the second sharing thin film transistor T23. Another one of the source electrode or the drain electrode of the second sub thin film transistor T22 is connected to the data line DL.

The second sub pixel electrode SP2 and the second main pixel electrode MP2 are arranged in sequence along the second direction DR2. The second main thin film transistor T21 is positioned between the second scanning line and the second sub pixel electrode SP2 in the second direction DR2. The second sub thin film transistor T22 and the second sharing thin film transistor T23 are positioned between the second main pixel electrode MP2 and the first scanning line in the second direction DR2.

It should be noted that in this embodiment, the positions of the second main thin film transistor T21, the second sub thin film transistor T22, and the second sharing thin film transistor T23 in the second pixel P2 can be reasonably arranged, which reduces the mutual connection paths, and minimizes coupling caused by crossovers between the connection paths.

A gate electrode of the second main thin film transistor T21 is directly connected to a second scanning line GLN+1. The second scanning line GLN+1 is connected to a gate electrode of the second sub thin film transistor T22 and a gate electrode of the second sharing thin film transistor T23 through the second connection line ZL2, and the second connection line ZL2 surrounds the second main pixel electrode MP2.

It should be noted that the gate electrode of the second main thin film transistor T21 can be integrally formed with the second scanning line GLN+1 to reduce the manufacturing process. Similarly, the second scanning line GLN+1, the second connection line ZL2, the gate electrode of the second sub thin film transistor T22, and the gate electrode of the second sharing thin film transistor T23 may also be integrally formed or constructed in a same film layer to reduce the manufacturing process. The second connection line ZL2 surrounds the second main pixel electrode MP2, which can avoid the second connection line ZL2 and the second main pixel electrode MP2 overlapping in the thickness direction of the display device to generate corresponding parasitic capacitances.

In one embodiment, the display device further includes a second common electrode line COM2. The data line DL and the second common electrode line COM2 are arranged in sequence along the second direction DR2 and are respectively positioned on two sides of the second pixel P2 in the second direction DR2. The second common electrode line COM2 is close to the second sharing thin film transistor T23 in the second direction DR2. The second common electrode line COM2 is connected to another one of the source electrode or the drain electrode of the second sharing thin film transistor T23. The data line DL is close to the second main thin film transistor T21 and the second sub thin film transistor T22 in the second direction DR2.

It should be noted that, in this embodiment, the positions of the second main thin film transistor T21, the second sub thin film transistor T22, and the second sharing thin film transistor T23 in the second pixel P2 can be reasonably arranged, to realize the first pixel P1 and the second pixel P2 sharing a same data line DL.

In one embodiment of the present application, the second connection line ZL2 includes a first wire ZL21 and a second wire ZL22. The first wire ZL21 is connected to a second scanning line GLN+1. The first wire ZL21 is positioned between a second main pixel electrode MP2 and a second common electrode line COM2 in the second direction DR2. The second wire ZL22 is connected to the first wire ZL21, the gate electrode of the second sub thin film transistor T22, and the gate electrode of the second sharing thin film transistor T23. The second wire ZL22 is positioned between the second main pixel electrode MP2 and the second sub thin film transistor T22 and/or the second sharing thin film transistor T23 in the first direction DR1.

It should be noted that setting the specific routing path of the second connection line ZL2 in this way can avoid overlapping or crossing with other metal routing lines or electrodes, thereby reducing mutual coupling or parasitic capacitance.

In one embodiment, the display device further includes a gate driving circuit 20 and at least one multiplexing circuit 10. The gate driving circuit 20 is configured to output at least one scanning signal. An input terminal of the multiplexing circuit 10 is connected to an output terminal of the gate driving circuit 20. A first output terminal of the multiplexing circuit 10 is connected to the first scanning line GLN. The second output terminal of the multiplexing circuit 10 is connected to the second scanning line GLN+1. The multiplexing circuit 10 is configured to output the first scanning signal and the second scanning signal according to one of the scanning signals. The first scanning line GLN is configured to transmit the first scanning signal. The second scanning line GLN+1 is configured to transmit the second scanning signal. A pulse of the first scanning signal is earlier than a pulse of the second scanning signal in one frame.

It should be noted that, in this embodiment, one scanning signal can be multiplexed into a first scanning signal and a second scanning signal, which can reduce a number of scanning signals output by the gate driving circuit 20, thereby reducing a structure of the gate driving circuit 20 and/or borders take up space. A number of gate driving chips used can also be reduced When the gate driving circuit 20 includes a plurality of gate driving chips.

In one embodiment, the multiplexing circuit 10 includes a first transistor MT1 and a second transistor MT2. One of a source electrode or a drain electrode of the first transistor MT1 is connected to the output terminal of the gate driving circuit 20. Another one of the source electrode or the drain electrode of the first transistor MT1 is connected to the first scanning line GLN. A gate electrode of the first transistor MT1 is connected to a first control terminal. One of a source electrode or a drain electrode of the second transistor MT2 is connected to one of the source electrode or the drain electrode of the first transistor MT1. Another one of the source electrode or the drain electrode of the second transistor MT2 is connected to the second scanning line GLN+1, and wherein a gate electrode of the second transistor MT2 is connected to the second control terminal or the first control terminal.

It should be noted that when the gate electrode of the first transistor MT1 and the gate electrode of the second transistor MT2 are both connected to the first control terminal, a channel type of the first transistor MT1 is different from a channel type of the second transistor MT2. For example, the channel type of the first transistor MT1 is one of N-channel or P-channel, then the channel type of the second transistor MT2 is another one of N-channel or P-channel, to ensure that the first transistor MT1, the second transistor MT2 is turned on or turned on at different times, thereby preventing the error that a same data line DL simultaneously charges two pixels in a pixel row at a same time.

The channel type of the first transistor MT1 and the channel type of the second transistor MT2 may be the same when the gate electrode of the first transistor MT1 is connected to the first control terminal and the gate electrode of the second transistor MT2 is connected to the second control terminal. For example, the channel type of the first transistor MT1 and the channel type of the second transistor MT2 can be either N-channel or P-channel. The first transistor MT1 and the second transistor MT2 are individually controlled by different control terminals. The control terminals can also be turned on or turned off in a time division manner to avoid an error that the same data line DL simultaneously charges two pixels in a pixel row at a same time.

The first control terminal is configured to provide a first control signal MUX1. The second control terminal is configured to provide a second control signal MUX2.

In one embodiment of the present application, this embodiment provides an electronic equipment. The electronic equipment includes the display device in at least one of the above-mentioned embodiments. A first scanning line in one scanning line group and a second scanning line in another scanning line group are disposed between two adjacent pixel rows.

It can be understood that, in the electronic equipment provided by the embodiments of the present application, by constructing a first scanning line and a second scanning line on two sides of a pixel row in a first direction DR1, it is possible to avoid overlapping of the first scanning line and/or the second scanning line with the pixel row in a thickness direction of the display device, which can prevent the sub pixel electrode of the first pixel P1 from being affected by an electrical potential change of the scanning signal, that is, an influence of a secondary feeder voltage, thereby maintaining voltages of the sub pixel electrodes of two adjacent pixels in a same row are the same, and improving a luminance uniformity of the sub pixel opening areas of two adjacent pixels in a same row.

An area where the pixel electrode is positioned may correspond to a pixel opening area. For example, an area where the sub pixel electrode positioned is a sub pixel opening area, and an area where the main pixel electrode positioned is a main pixel opening area.

It should be noted that, in this embodiment, each scanning line can be arranged between different pixels without crossing or passing the pixels. Therefore, each pixel can be protected from an adverse influence of a secondary feeder voltage and maintained a uniformity of brightness.

It can be understood that, for those of ordinary skill in the art, equivalent replacements or changes can be made according to the technical solutions of the present application and the inventive concept thereof. All these changes or replacements should belong to a protection scope of the appended claims of the present application.

What is claimed is:

1. A display device, comprising:
   a plurality of scanning lines comprising one or more groups of scanning lines, wherein each of the groups of scanning lines comprises a first scanning line and a second scanning line sequentially arranged along a first direction; and
   a plurality of pixels comprising at least one pixel row, wherein each pixel row comprises at least one pixel group, and wherein each pixel group comprises a first pixel and a second pixel arranged in sequence along a second direction perpendicular to the first direction;
   wherein the each pixel row is positioned between the first scanning line and the second scanning line of one of the groups of scanning lines, wherein the first scanning line of the one of the groups of scanning lines is electrically connected to the first pixel of each pixel group in the each pixel row and is not electrically connected to the second pixel of each pixel group in the each pixel row, and wherein the second scanning line of the one of the groups of scanning lines is electrically connected to the second pixel of each pixel group in the each pixel row and is not electrically connected to the first pixel of each pixel group in the each pixel row;
   wherein the first pixel comprises a first main thin film transistor, a first sub thin film transistor, a first sharing thin film transistor, a first main pixel electrode, a first sub pixel electrode, and a first connection line, wherein one of a source electrode or a drain electrode of the first main thin film transistor is connected to the first main pixel electrode, and wherein the first sub pixel electrode is connected to one of a source electrode or a drain electrode of the first sub thin film transistor and one of a source electrode or a drain electrode of the first sharing thin film transistor;
   wherein the first main pixel electrode and the first sub pixel electrode are arranged in sequence along the first direction, wherein the first main thin film transistor is positioned between the first scanning line and the first sub pixel electrode in the first direction, and wherein the first sub thin film transistor and the first sharing thin film transistor are positioned between the first main pixel electrode and the second scanning line in the first direction; and
   wherein a gate electrode of the first main thin film transistor is directly connected to the first scanning line, wherein the first scanning line is connected to a gate electrode of the first sub thin film transistor and a gate electrode of the first sharing thin film transistor through the first connection line, and wherein the first connection line surrounds the first main pixel electrode.

2. The display device according to claim 1, wherein the display device further comprises:
- a data line positioned between the first pixel and the second pixel in the second direction, wherein the data line is close to the first main thin film transistor and the first sub thin film transistor in the second direction, and wherein the data line is connected to another one of the source electrode or the drain electrode of the first main thin film transistor and another one of the source electrode or the drain electrode of the first sub thin film transistor; and
- a first common electrode line, wherein the first common electrode line and the data line are arranged in sequence along the second direction and are respectively positioned on two sides of the first pixel in the second direction, wherein the first common electrode line is close to the first sharing thin film transistor in the second direction, and wherein the first common electrode line is connected to another one of the source electrode or the drain electrode of the first sharing thin film transistor.

3. The display device according to claim 2, wherein the first connection line comprises:
- a first trace positioned between the first common electrode line and the first main pixel electrode in the second direction, wherein the first trace is connected to the first scanning line; and
- a second trace connected to the first trace, the gate electrode of the first sub thin film transistor, and the gate electrode of the first sharing thin film transistor, and wherein the second trace is positioned between the first main pixel electrode and the first sub thin film transistor and/or the first sharing thin film transistor in the first direction.

4. The display device according to claim 3, wherein the second pixel comprises a second main thin film transistor, a second sub thin film transistor, a second sharing thin film transistor, a second main pixel electrode, a second sub pixel electrode, and a second connection line, wherein one of a source electrode or a drain electrode of the second main thin film transistor is connected to the second main pixel electrode, wherein another one of the source electrode or the drain electrode of the second main thin film transistor is connected to the data line, wherein the second sub pixel electrode is connected to one of a source electrode or a drain electrode of the second sub thin film transistor, and one of a source electrode or a drain electrode of the second sharing thin film transistor, and wherein another one of the source electrode or the drain electrode of the second sub thin film transistor is connected to the data line;
wherein the second sub pixel electrode and the second main pixel electrode are arranged in sequence along the second direction, wherein the second main thin film transistor is positioned between the second scanning line and the second sub pixel electrode in the second direction, and wherein the second sub thin film transistor and the second sharing thin film transistor are positioned between the second scanning line and the second main pixel electrode in the second direction; and
wherein a gate electrode of the second main thin film transistor is directly connected to the second scanning line, wherein the second scanning line is connected to a gate electrode of the second sub thin film transistor and a gate electrode of the second sharing thin film transistor through the second connection line, and wherein the second connection line surrounds the second main pixel electrode.

5. The display device according to claim 4, wherein the display device further comprises a second common electrode line, wherein the data line and the second common electrode line are arranged in sequence along the second direction and positioned on two sides of the second pixel along the second direction, wherein the second common electrode line is close to the second sharing thin film transistor in the second direction, and wherein the second common electrode line is connected to another one of the source electrode or the drain electrode of the second sharing thin film transistor; and
wherein the data line is close to the second main thin film transistor and the second sub thin film transistor in the second direction.

6. The display device according to claim 5, wherein the second connection line comprises:
- a first wire connected to the second scanning line, wherein the first wire is positioned between the second main pixel electrode and the second common electrode line in the second direction; and
- a second wire, wherein the second wire is connected to the first wire, the gate electrode of the second sub thin film transistor, and the gate electrode of the second sharing thin film transistor, wherein the second wire is positioned between the second main pixel electrode and the second sub thin film transistor and/or the second sharing thin film transistor in the first direction.

7. The display device according to claim 1, wherein the display device further comprises:
- a gate driving circuit configured to output at least one scanning signal; and
- at least one multiplexing circuit, wherein an input terminal of the multiplexing circuit is connected to an output terminal of the gate driving circuit, wherein a first output terminal of the multiplexing circuit is connected to the first scanning line, wherein a second output terminal of the multiplexing circuit is connected to the second scanning line, and wherein the multiplexing circuit is configured to output a first scanning signal and a second scanning signal according to one of the scanning signals;
wherein the first scanning line is configured to transmit the first scanning signal, and wherein the second scanning line is configured to transmit the second scanning signal; and wherein a pulse of the first scanning signal is earlier than a pulse of the second scanning signal in one frame.

8. The display device according to claim 7, wherein the multiplexing circuit comprises:
- a first transistor, wherein one of a source electrode or a drain electrode of the first transistor is connected to the output terminal of the gate driving circuit, and another one of the source electrode or the drain electrode of the first transistor is connected to the first scanning line, and wherein a gate electrode of the first transistor is connected to a first control terminal; and
- a second transistor, wherein one of a source electrode or a drain electrode of the second transistor is connected to one of the source electrode or the drain electrode of the first transistor, and wherein another one of the source electrode or the drain electrode of the second transistor is connected to the second scanning line, and wherein a gate electrode of the second transistor is connected to a second control terminal or a first control terminal.

9. An electronic equipment, comprising the display device according to claim 1, wherein a first scanning line in one scanning line group and a second scanning line in the other scanning line group are disposed between two adjacent pixel rows.

* * * * *